US010660250B2

(12) United States Patent
Kawaguchi

(10) Patent No.: US 10,660,250 B2
(45) Date of Patent: May 19, 2020

(54) MOUNTING DEVICE AND CONTROL METHOD OF MOUNTING DEVICE

(71) Applicant: FUJI CORPORATION, Chiryu-shi (JP)

(72) Inventor: Koji Kawaguchi, Kasugai (JP)

(73) Assignee: FUJI CORPORATION, Chiryu-shi (JP)

(*) Notice: Subject to any disclaimer, the term of this patent is extended or adjusted under 35 U.S.C. 154(b) by 204 days.

(21) Appl. No.: 15/549,726

(22) PCT Filed: Oct. 26, 2015

(86) PCT No.: PCT/JP2015/080067
§ 371 (c)(1),
(2) Date: Aug. 9, 2017

(87) PCT Pub. No.: WO2016/129151
PCT Pub. Date: Aug. 18, 2016

(65) Prior Publication Data
US 2018/0049355 A1 Feb. 15, 2018

(30) Foreign Application Priority Data
Feb. 13, 2015 (JP) .................. PCT/JP2015/053981

(51) Int. Cl.
H05K 13/08 (2006.01)
H05K 13/04 (2006.01)
(Continued)

(52) U.S. Cl.
CPC .......... H05K 13/08 (2013.01); B25J 15/0616 (2013.01); H05K 3/301 (2013.01);
(Continued)

(58) Field of Classification Search
CPC ............... H05K 13/04; H05K 13/0409; H05K 13/0015; Y10T 29/53178; Y10T 29/4913; Y10T 29/53052
(Continued)

(56) References Cited

U.S. PATENT DOCUMENTS 6,389,683 B1* 5/2002 Mori ...................... B23K 3/082
29/740
7,849,588 B2* 12/2010 Onishi ................. H05K 13/082
29/743
(Continued)

FOREIGN PATENT DOCUMENTS

EP 1 213 083 A2 6/2002
JP 2006-147640 A 6/2006
(Continued)

OTHER PUBLICATIONS

International Search Report dated Jan. 26, 2016 in PCT/JP2015/080067 filed Oct. 26, 2015.
(Continued)

Primary Examiner — Michael J Brown
(74) Attorney, Agent, or Firm — Oblon, McClelland, Maier & Neustadt, L.L.P.

(57) ABSTRACT

A mounting device is provided with a first raising and lowering drive section that raises and lowers a syringe member to which a suction nozzle that picks up a component is attached, and a second raising and lowering drive section that raises and lowers the suction nozzle with respect to the syringe member to which the suction nozzle is attached. The mounting device controls a raising and lowering operation of the first raising and lowering drive section based on height information that includes at least one of information of the thickness of the component or information of the stage height of a transfer stage.

4 Claims, 8 Drawing Sheets

(51) Int. Cl.
  *B25J 15/06*     (2006.01)
  *H05K 3/30*      (2006.01)
  *H05K 13/00*     (2006.01)

(52) U.S. Cl.
  CPC ..... *H05K 13/0413* (2013.01); *H05K 13/0469* (2013.01); *H05K 13/0853* (2018.08)

(58) Field of Classification Search
  USPC ........................................................ 700/121
  See application file for complete search history.

(56) References Cited

U.S. PATENT DOCUMENTS

| | | |
|---|---|---|
| 2002/0070460 A1 | 6/2002 | Uchida et al. |
| 2005/0017052 A1 | 1/2005 | Uchida et al. |
| 2005/0023326 A1 | 2/2005 | Uchida et al. |
| 2005/0023681 A1 | 2/2005 | Uchida et al. |
| 2008/0127486 A1* | 6/2008 | Hirata ............... H01L 21/67144 29/832 |
| 2016/0192552 A1 | 6/2016 | Yamada |

FOREIGN PATENT DOCUMENTS

| | | |
|---|---|---|
| JP | 2006-196819 A | 7/2006 |
| JP | 2014-60363 A | 4/2014 |
| JP | 2014-78581 A | 5/2014 |
| WO | 2014/080472 A1 | 5/2014 |
| WO | WO 2015/019447 A1 | 2/2015 |

OTHER PUBLICATIONS

Extended European Search Report dated Jan. 30, 2018 in Patent Application No. 15882025.8, 15 pages.

\* cited by examiner

MOUNTING DEVICE AND CONTROL METHOD OF MOUNTING DEVICE

TECHNICAL FIELD

The present invention relates to a mounting device and a control method of a mounting device.

BACKGROUND ART

Conventionally, there are known mounting devices provided with a first linear motor that raises and lowers a first raising and lowering member, and a second linear motor that raises and lowers a nozzle attached to an end of the first raising and lowering member (for example, refer to patent literature 1). With this mounting device, it is possible to avoid damage due to contact impact with either the suction nozzle or board while maintaining high mounting efficiency of mounting components on boards by performing relatively precise raising and lowering with the second linear motor.

Also, with a mounting device, mounting of components onto a board is performed after a transfer material such as flux or conductive paste is transferred by a transfer device (for example, refer to patent literature 2).

CITATION LIST

Patent Literature

Patent literature 1: WO2014/080472
Patent literature 2: JP-A-2014-78581

SUMMARY OF INVENTION

Technical Problem

However, although one may consider transferring a transfer material using a transfer device in the mounting device of patent literature 1 above, for cases in which there are changes in the positional relationship in the height direction between the upper surface of the transfer stage and the nozzle due to attaching the transfer device and attaching the mounting head, or cases in which there is variance in the component thickness, it would be necessary to have a relatively large margin of error, thus lengthening the raising and lowering stroke of the second linear motor.

The present invention take account of such problems, and an object thereof is to provide a mounting device and a control method of a mounting device that allows a shorter raising and lowering stroke in a configuration that raises and lowers a raising and lowering member to which a pickup member is attached and raises and lowers the pickup member.

Solution to Problem

The present invention uses the following means to achieve the above object.

A mounting device of the present invention is a mounting device for arranging components on a board, the mounting device including:

a first raising and lowering drive section configured to raise and lower a raising and lowering member to which a pickup member configured to pick up a component is attached;

a second raising and lowering drive section configured to raise and lower the pickup member with respect to the raising and lowering member;

a transfer device including a transfer stage, the transfer device being configured to form a transfer film of a transfer material on the transfer stage;

a height measurement device configured to measure at least one of a stage height of the transfer stage or a component thickness of the component; and a control section configured to control raising and lowering operation of at least the first raising and lowering drive section when transferring the transfer film to the component, based on height information that includes at least one of information of the component thickness or information of the stage height measured by the height measuring device.

The mounting device is provided with a first raising and lowering drive section configured to raise and lower a raising and lowering member to which a pickup member configured to pick up a component is attached, and a second raising and lowering drive section configured to raise and lower the pickup member with respect to the raising and lowering member. Also, the mounting device controls at least raising and lowering operation of the first raising and lowering drive section when transferring a transfer film to the component, based on height information that includes at least one of component thickness information or information of stage height measured by a measuring section. With this device, it is possible to move the raising and lowering member to a position close to the transfer stage in accordance with the stage height or component thickness. Accordingly, with this device, in a configuration for raising and lowering a raising and lowering member to which a pickup member is attached, and for raising and lowering the pickup member, it is possible to make the raising and lowering stroke of the pickup member shorter. Thus, with this device, the device can be made more compact.

With a mounting device according to the present invention, the control section, using the height information, may be configured to control raising and lowering operation of the first raising and lowering drive section such that the raising and lowering member is positioned at a stopping position such that a distance between the transfer stage and the raising and lowering member is a distance corresponding to a raising and lowering stroke of the pickup member.

With a mounting device according to the present invention, the control section may be configured to calculate at least one of (a) a height difference value of the stage height measured by the height measurement device with respect to a design value of the stage height, or (b) a thickness value of the component thickness measured by the height measurement device with respect to a design value of the component thickness, set a correction value of the stopping position of the raising and lowering member with respect to a design value stopping position based on the calculated height difference value, or the calculated thickness difference value, or both the calculated height difference value and the calculated thickness difference value, and control raising and lowering operation of the first raising and lowering drive section when transferring the transfer film to the component using the correction value.

Also, with a mounting device according to the present invention, the control section may be configured to set at least a portion of the difference value as the correction value, and perform control such that a remaining portion of the difference value is covered by the raising and lowering stroke of the pickup member by the second raising and lowering drive section.

Further, the control section may be configured to, with respect to the difference value, set the correction value such that the correction value is larger than the covering stroke of the second raising and lowering drive section. With this mounting device, with respect to the difference value, because the stroke covered by the second raising and lowering drive section is shorter than the correction value of the stopping position, it is possible to shorten even more the raising and lowering stroke of the pickup member.

Also, with a mounting device according to the present invention, the control section may be configured to perform control of raising and lowering operation of the first raising and lowering drive section such that a separation distance between the transfer stage and the component held by the pickup member at a reference height of the pickup member at a stopping position of the raising and lowering member is a constant distance, based on the height information. With this mounting device, by performing control of raising and lowering operation of the first raising and lowering drive section such that a separation distance between the transfer stage and the component held by the pickup member at a reference height of the pickup member at a stopping position of the raising and lowering member is a constant distance, raising and lowering operation of the second raising and lowering drive section becomes constant, and the raising and lowering stroke of the pickup member can be even shorter.

A mounting device according to the present invention may further include a detecting section configured to detect a load applied to the pickup member, and the control section, in raising and lowering control of the raising lowering member or the pickup member or both, may measure at least one of the stage height or the component thickness by detecting contact with a member to which the raising and lowering member is attached using the detecting section. With this unit, it is possible to measure the height of the stage or the thickness of the component using the detecting section that detects the load applied to the pickup member. Here, a member attached to a raising and lowering member, for example, may be a pickup member, or a jig attached to the raising and lowering member instead of the pickup member. Note that, the detecting section may detect the load applied to the pickup member when the component is mounted on the board. At this time, the control section may measure the thickness of the component by contacting the component against a specified reference surface with the component held by the pickup member.

A mounting device of the present invention is a mounting device for arranging components on a board, the mounting device comprising:

a first raising and lowering drive section configured to raise and lower a raising and lowering member to which a pickup member configured to pick up a component is attached;

a second raising and lowering drive section configured to raise and lower the pickup member with respect to the raising and lowering member;

a transfer device including a transfer stage, the transfer device being configured to form a transfer film of a transfer material on the transfer stage;

a height measurement device configured to measure at least one of a stage height of the transfer stage or a lower surface height of a lower surface of the component held by the pickup member; and a control section configured to control raising and lowering operation of at least the first raising and lowering drive section when transferring the transfer film to the component, based on height information that includes at least one of information of the lower surface height or information of the stage height measured by the height measuring device. With this device, it is possible to move the raising and lowering member to a position close to the transfer stage in accordance with the stage height or lower surface height. Accordingly, with this device, in a configuration for raising and lowering a raising and lowering member to which a pickup member is attached, and for raising and lowering the pickup member, it is possible to make the raising and lowering stroke of the pickup member shorter. Thus, with this device, the device can be made more compact. Note that, the mounting device may be applied to any configuration of mounting device given above. For example, for any of the mounting devices, the terms "component thickness" and lower surface height" may be used interchangeably.

A control method of the present invention is a control method of a mounting device, the mounting device including: a first raising and lowering drive section configured to raise and lower a raising and lowering member to which a pickup member configured to pick up a component is attached; a second raising and lowering drive section configured to raise and lower the pickup member with respect to the raising and lowering member; and a transfer device including a transfer stage, the transfer device being configured to form a transfer film of a transfer material on the transfer stage, the control method comprising: controlling raising and lowering operation of at least the first raising and lowering drive section when the component contacts the transfer film, based on height information that includes at least one of information of component thickness or information of stage height measured by the height measuring device.

With this control method, in the same manner as with the above mounting device, it is possible to move the entire raising and lowering member to a position closer to the transfer stage in accordance with the stage height or component thickness. Accordingly, with this control method, in a configuration for raising and lowering a raising and lowering member to which a pickup member is attached, and for raising and lowering the pickup member, it is possible to make the raising and lowering stroke of the pickup member shorter. Note that, for the control method of the mounting device, various forms of the above mounting device may be used, and steps to realize various functions on the above mounting device may be added.

DESCRIPTION OF EMBODIMENTS

Figure 1:
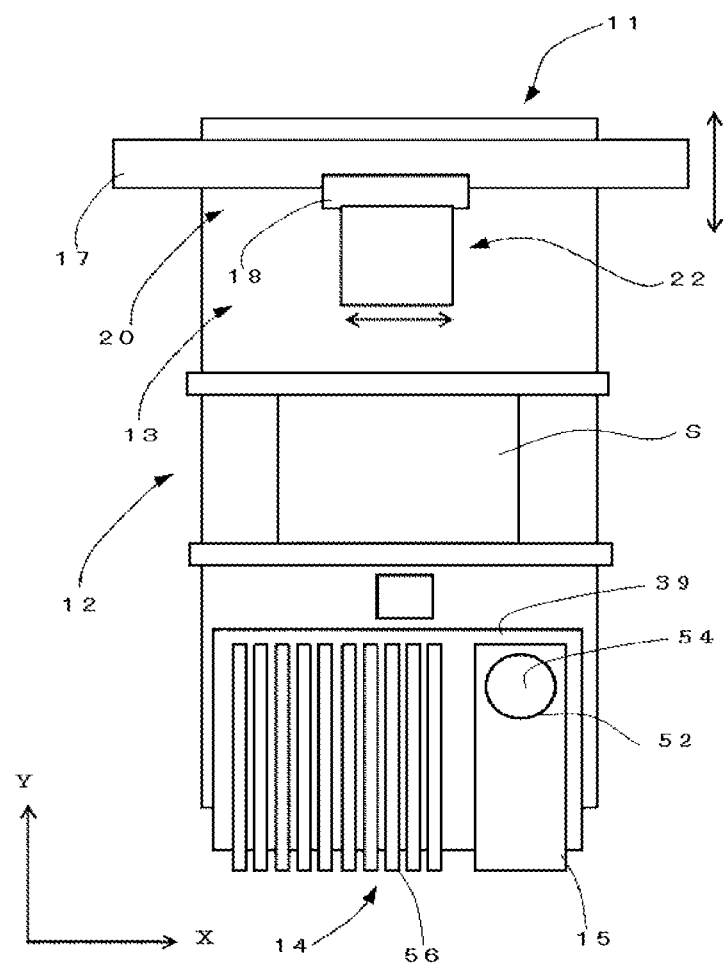
FIG. 1 is a schematic viewing showing an example of mounting device 11.
Figure 2:
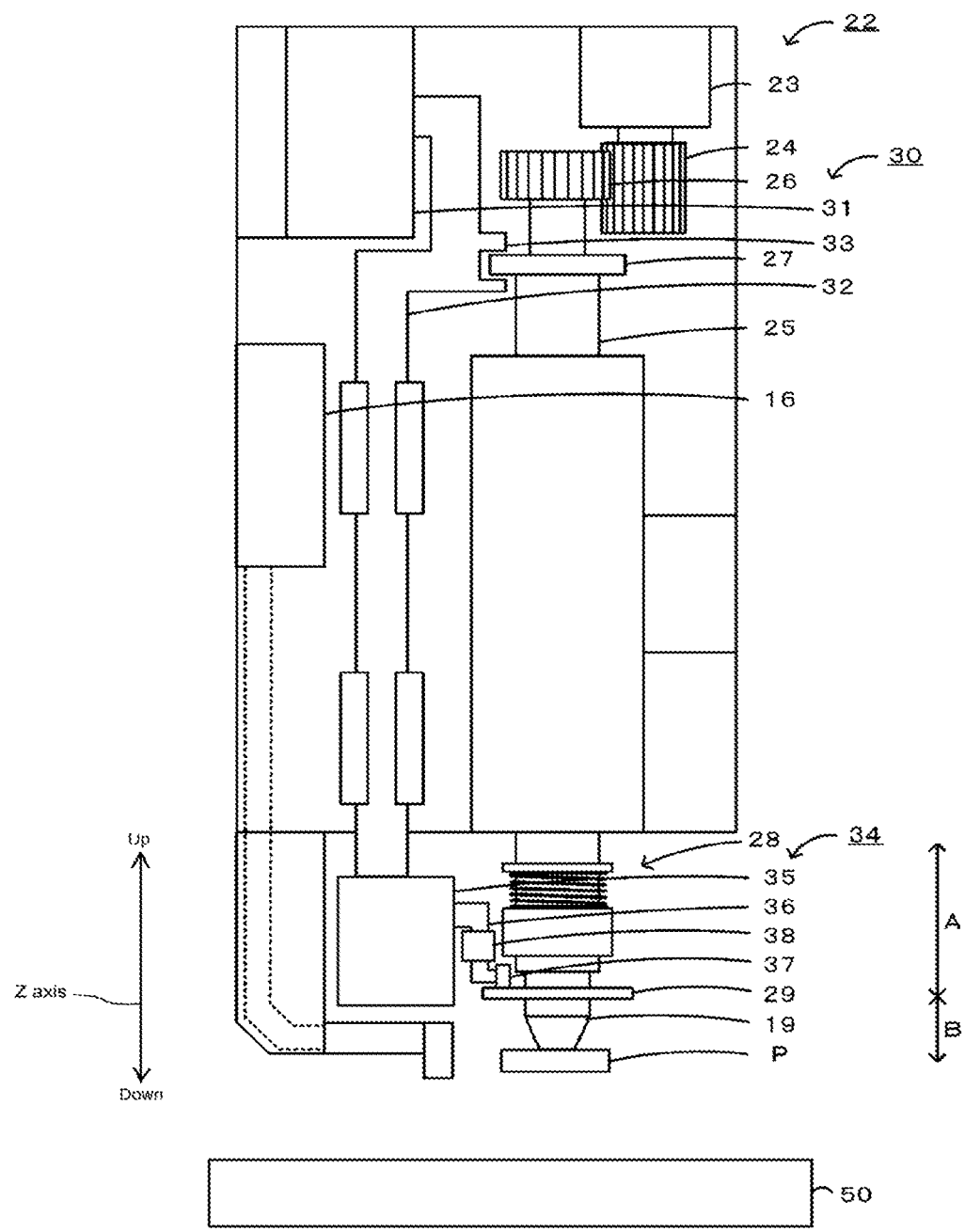
FIG. 2 shows the configuration of mounting head 22.
Figure 3:
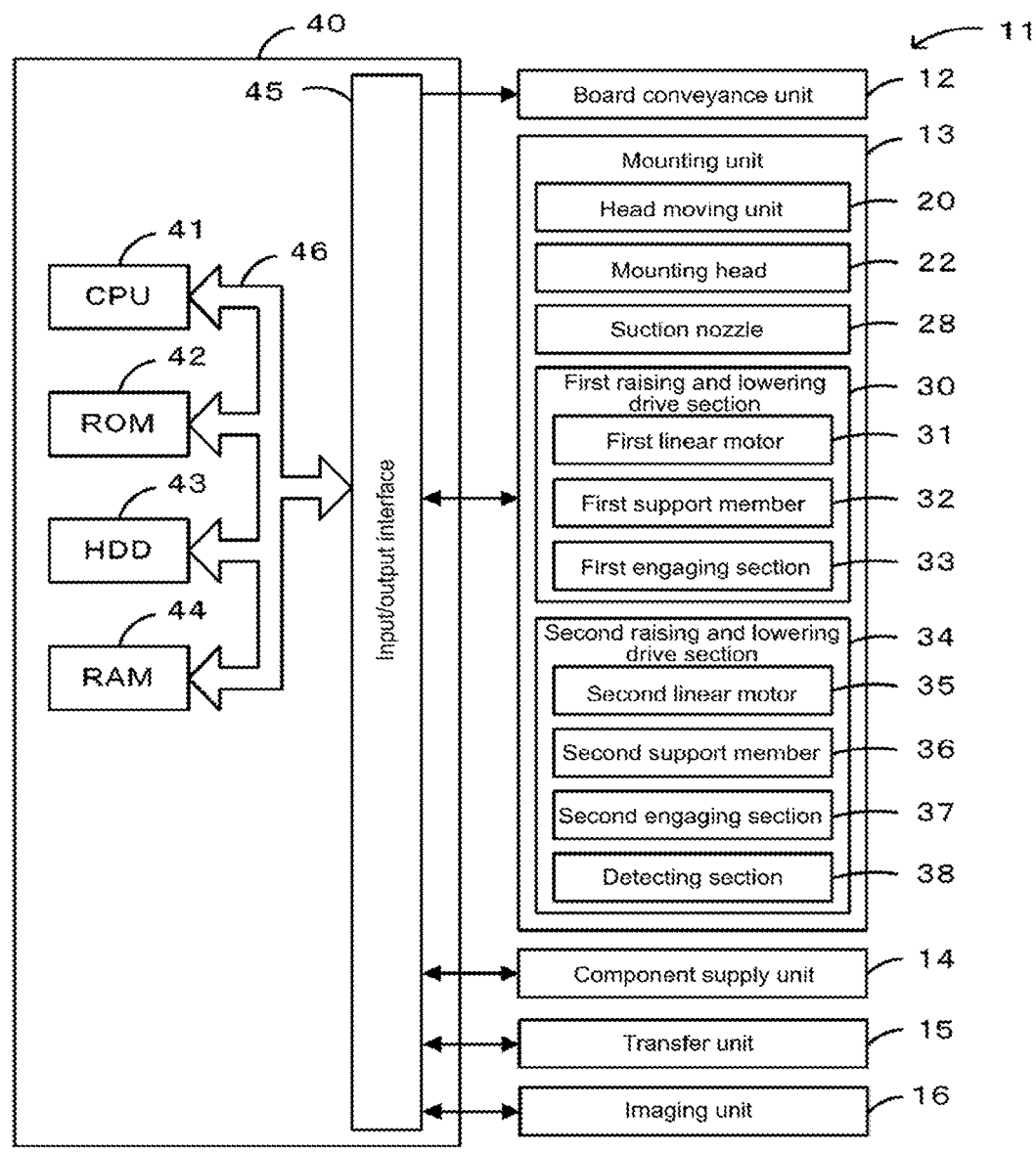
FIG. 3 is a block diagram showing the configuration of mounting device 11.

Hereinafter, an embodiment of the present invention will be described with reference to the figures. FIG. 1 is a schematic viewing showing an example of mounting device 11. FIG. 2 shows the configuration of mounting head 22. FIG. 3 is a block diagram showing the configuration of mounting device 11. Mounting device 11 performs processing of mounting components P on board S. Also, in the present embodiment, left-right directions (X axis), front-rear directions (Y axis), and up-down directions (Z axis) are set as shown in FIGS. 1 and 2.

As shown in FIGS. 1 to 3, mounting device 11 is provided with board conveyance unit 12, mounting unit 13, component supply unit 14, transfer unit 15, imaging unit 16, and control device 40. Board conveyance unit 12 loads board S, conveys board S, fixes board S at a mounting position, and unloads board S. Board conveyance unit 12 includes a pair of conveyor belts provided extending in a left-right direction and separated in the front-rear direction of FIG. 1. Board S is conveyed by these conveyor belts.

Mounting unit 13 picks up component P from component supply unit 14 and mounts the component P on board S fixed by board conveyance unit 12. Mounting unit 13 is provided with head moving section 20, mounting head 22, and suction nozzle 28. Head moving section 20 is provided with Y slide 17 supported on guide rails (not shown) so as to be movable in a front-rear direction, and a motor that drives Y slide 17. Also, head moving section 20 is provided with X slide 18 supported on Y slide 17 so as to be movable in a left-right direction, and a motor that drives X-slide 18. Mounting head 22 is removably attached to X slide 18 and is moved in the XY directions by heading moving section 20. At least one suction nozzle 28 is removably attached to an underside of mounting head 22. As shown in FIG. 2, at least one long cylindrical syringe member 25 is provided on mounting head 22 to be rotatable around a center axis and to be movable in a vertical direction. Suction nozzle 28 is removably attached to the lower end of syringe member 25. Syringe member 25 to which suction nozzle 28 is attached corresponds to the raising and lowering member. Gear 26 is provided at the top end of syringe member 25. Mounting head 22 is provided with Q-axis motor 23 that includes gear 24. With Q-axis motor 23, gear 24 engages with gear 26, and by rotating syringe member 25 via gear 26, the angle of component P held by suction nozzle 28 is adjusted.

Suction nozzle 28 uses pressure to hold a component P at the nozzle tip and release the component P being held at the nozzle tip. Suction nozzle 28 includes disk-shaped flange 29, and pipe section 19 formed at the tip (refer to FIG. 2). Pipe section 19 is arranged in the main body of suction nozzle 28 so as to be slidable in the Z-axis direction (vertical direction). With mounting head 22, syringe member 25 and suction nozzle 28 are raised and lowered in the Z-axis direction at a single raising and lowering position positioned at the tip end in the Y-axis direction of mounting head 22. Note that, a pickup member for picking up component P is described here as suction nozzle 28, but the pickup member is not limited to this so long as it is capable of picking up component P, for example, a mechanical chuck that picks up component P by grabbing, or the like, may be used.

As shown in FIG. 2, mounting head 22 is provided with first raising and lowering drive section 30 and second raising and lowering drive section 34, and adjusts the height of suction nozzle 28 along the Z axis using first raising and lowering drive section 30 and second raising and lowering drive section 34. First raising and lowering drive section 30 is for raising and lowering the entire syringe member 25 to which suction nozzle 28 that picks up a component P is attached. First raising and lowering drive section 30 is provided with first linear motor 31 and first support member 32. First linear motor 31 moves first support member 32 up and down over movement range A, which is relatively long (refer to FIG. 2). First support member 32 is formed in the vertical direction and is supported by first linear motor 31. Second raising and lowering drive section 34 is arranged on the lower end of first support member 32. First engaging section 33 that engages with disk-shaped horizontal section 27 formed on syringe member 25 is formed on the lower end side of first support member 32. Second raising and lowering drive section 34 is for raising and lowering suction nozzle 28 of syringe member 25. Second raising and lowering drive section 34 is provided with second linear motor 35, second support member 36, second engaging section 37, and detecting section 38. Second linear motor 35 moves second support member 36 up and down over movement range B, which is relatively short compared to movement range A (refer to FIG. 2). Second support member 36 is formed in the vertical direction and is supported by second linear motor 35. Second engaging section 37 is formed on the lower end of second support member 36. Second engaging section 37 is engaged with flange 29 of suction nozzle 28. Second raising and lowering drive section 34, by the drive force of second linear motor 35, moves suction nozzle 28 up and down directly via second engaging section 37 and flange 29. Detecting section 38, which is a load cell, is arranged on second support member 36, such that detecting the load applied to second engaging section 37 is possible. Mounting head 22 lowers suction nozzle 28 at high speed using first raising and lowering drive section 30, and lowers suction nozzle 28 at low speed using second raising and lowering drive section 34, and performs drive control when component P contacts board S based on a detection result of detecting section 28, such that the load applied to component P is reduced. Mounting device 11 is provided with reference member 50 on which a reference surface used as the reference height is formed.

As shown in FIG. 1, component supply device 14 is provided with feeder support table 39, and tape feeder 56 that supplies tapes components. An upper surface of feeder support table 39 includes multiple slots, and tape feeders 56 are removably attached to these slots. Also, transfer unit 15 is removably attached to slots of feeder support table 39 in a similar manner to tape feeders 56.

Transfer unit 15 is provided with a transfer tank containing transfer material that is one of flux, solder, conductive paste, or adhesive. Transfer tank 52 rotates by being driven by a motor (not shown) or the like. A squeegee (not shown) is arranged above transfer tank 52, and squeegeeing occurs due to the rotation of transfer tank 52 such that a transfer film of transfer material is formed on transfer stage 54.

Imaging unit 16 is for imaging suction nozzle 28 that is holding a component P from the side. Imaging unit 16 is provided with an imaging element, a mirror, and image processing section. Control device 40 detects items such as deviation of the pickup position of component P, deformation of component P, and damage using the image captured by imaging unit 16.

As shown in FIG. 3, control device 40 is configured from a microprocessor based around CPU 41, ROM 42 that memorizes a processing program, HDD 43 that memorizes various data, RAM 44 used as working memory, input/output interface 45 for performing communication of electric signals with external devices, and so on, and these are connected by bus 46. Control device 40 outputs control signals to board conveyance unit 12, mounting unit 13, component supply unit 14, transfer unit 15, and imaging unit 16, and receives signals from mounting unit 13, component supply unit 14, transfer unit 15, and imaging unit 16.

Also, mounting device 11 is provided with an input device such as a keyboard and mouse for an operator to input various commands, and a display to display various information, and these input device and display are connected to control device 40.

Figure 4:
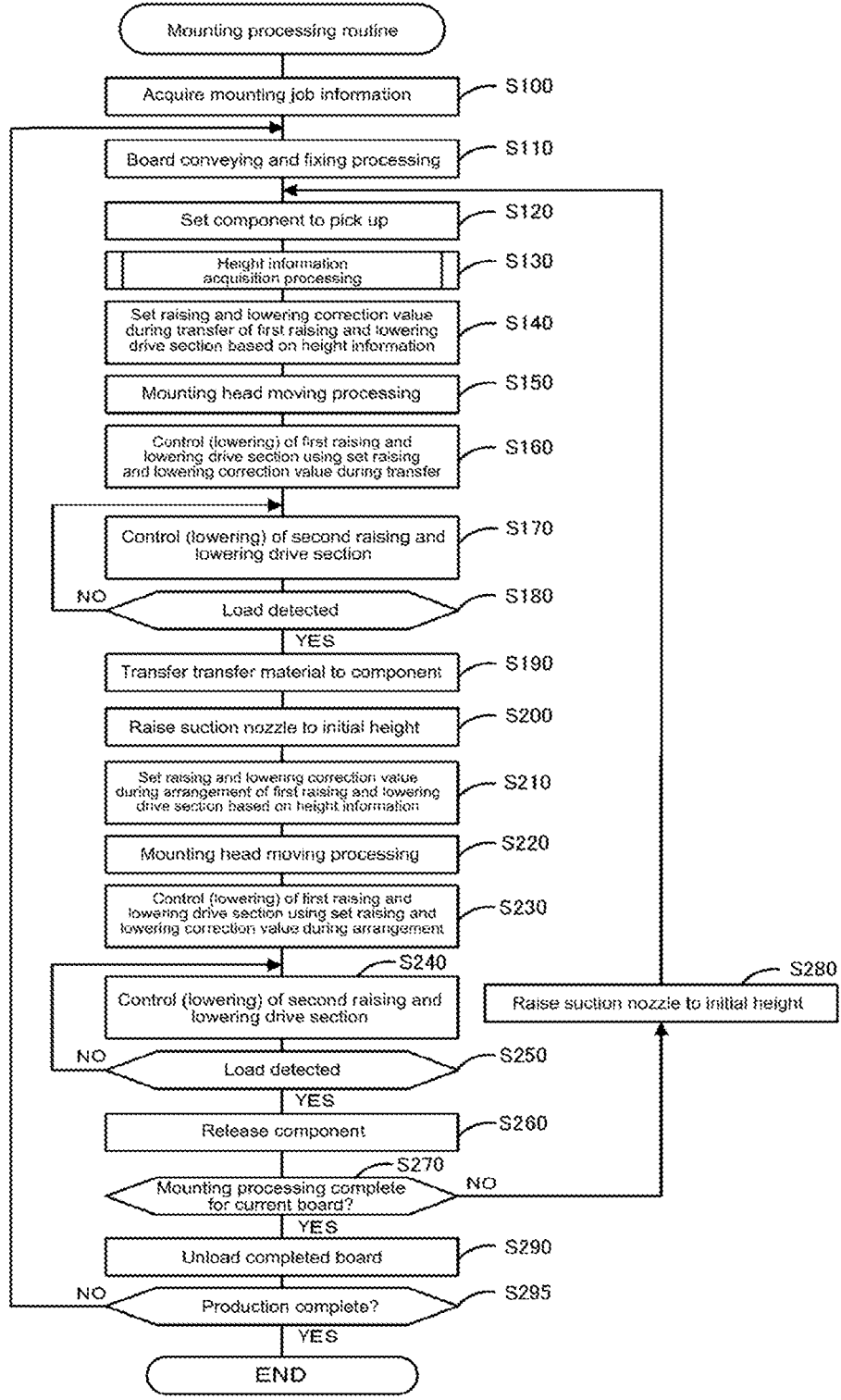
FIG. 4 is a flowchart showing an example of a mounting processing routine.

Next, operation of mounting device 11 of the present embodiment as configured above is described, specifically, mounting processing of mounting device 11. FIG. 4 is a flowchart showing an example of mounting processing performed by CPU 41 of control device 40. This routine is memorized on HDD 43 of control device 40 and is performed based on a start command from an operator. Here, descriptions are mainly given of a case in which components P are mounted on board S using suction nozzle 28 by way of two-step control of first raising and lowering drive section 30 and second raising and lowering drive section 34. When the routine is started, first, CPU 41 of control device 40 acquires mounting job information from management computer 50 (step S100). Included in mounting job information are the mounting order of components P, the types and characteristics of components P to be mounted, and information related to suction nozzle 28 used to pick up component P. Next, CPU 41 performs board S conveyance and fixing processing (step S110), and sets the component P to pick up (step S120). Then, CPU 41 performs processing to acquire height information including at least one of height information of board S, thickness information of component P, or height information of transfer stage 54 (step S130).

Figure 5:
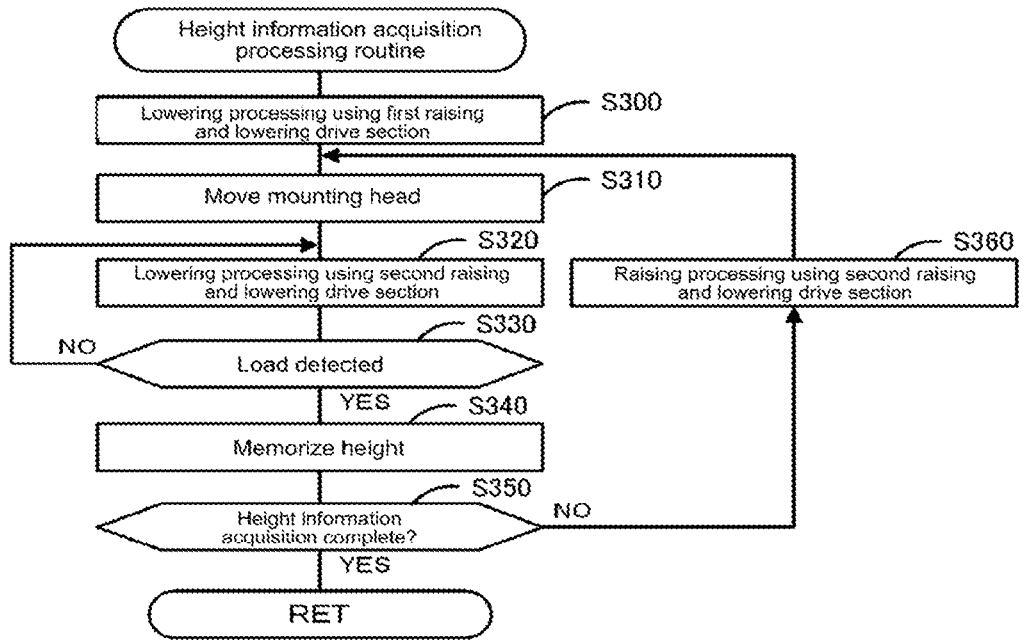
FIG. 5 is a flowchart showing an example of a height information acquiring and processing routine.
Figure 6:
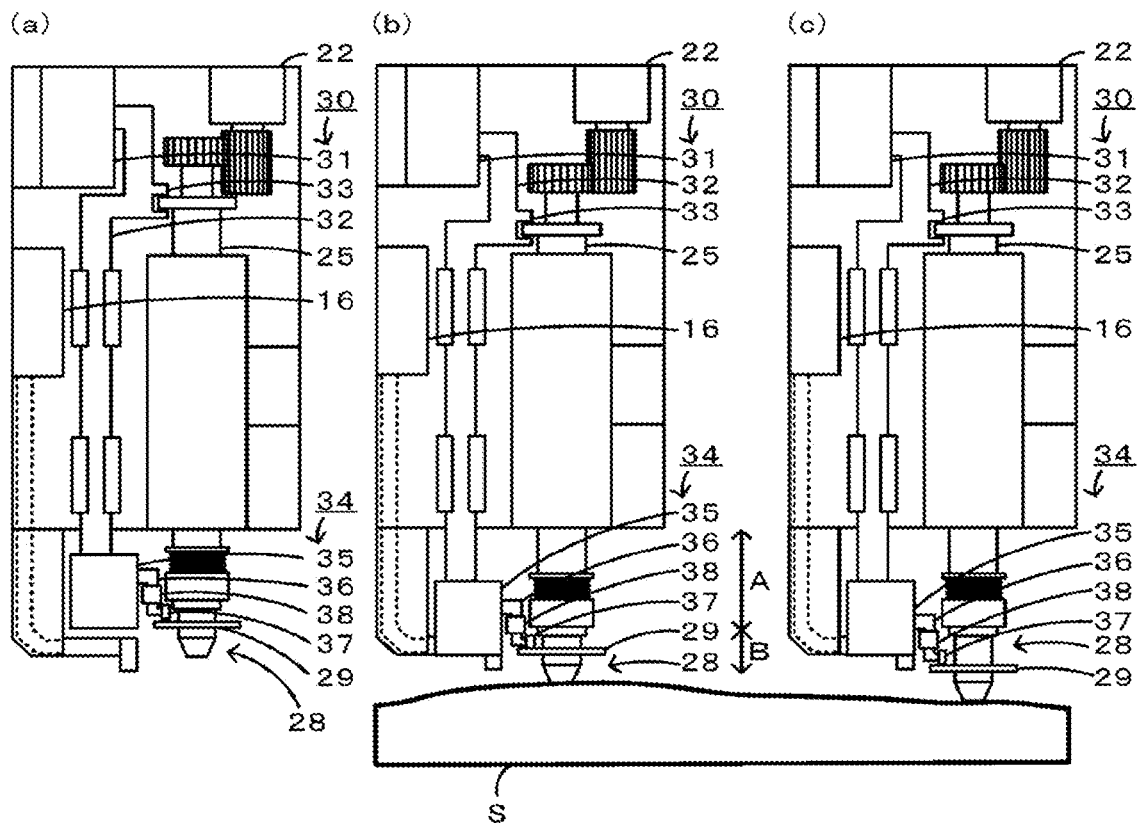
FIG. 6 shows an example of measuring the height of board S.

FIG. 5 is a flowchart showing an example of a height information acquiring and processing routine. This routine is memorized on HDD 43 of control device 40. Here, control device 40, during raising and lowering control of syringe member 25, measures the height of board S, the thickness of component P, and the height of transfer stage 54 by detecting contact with suction nozzle 28 using detecting section 38. First descriptions are given of processing for measuring the height of board S. There are cases in which board S is deformed, such as by warpage or unevenness. Here, control device 40 performs processing to measure the height of the upper surface of board S using detecting section 38 of mounting head 22. FIG. 6 shows an example of measuring the height of board S, with FIG. 6(a) showing an initial state, and FIGS. 6(b) and 6(c) showing a measuring state after first raising and lowering drive section 30 has been lowered. Note that, suction nozzle 28 is used as the detecting member at the tip that finds out the height of board 5, but instead of suction nozzle 28 a measuring jig may be attached to syringe member 25 and then processing be performed using the measuring jig.

When this routine is started, CPU 41 lowers first support member 32 using first raising and lowering drive section 30, and performs processing to lower the entire suction nozzle 28 and syringe member 25 (step S300). First raising and lowering drive section 30 lowers suction nozzle 28 to a specified reference height. Next, mounting head 22 is moved to a measurement point of board S (step S310). Measurement points, for example, may be multiple predetermined points in a lengthwise and widthwise direction such that deformation of board S can be identified. Also, the first measurement point is the upper surface (reference surface) of reference member 50. CPU 41, for example, acquires the height of the reference surface of reference member 50 as a reference value based on an encoder value of second linear motor 35. Continuing, CPU 41 lowers second support member 36 slowly using second raising and lowering drive section 34 (step S320), and determines whether detecting section 38 detected a load being applied based on a signal of detecting section 38 (step S330). If detecting section 38 has not detected a load, CPU 41 continues processing of step S320, and if detecting section 38 has detected a load, the height from the reference surface is memorized in RAM 44 as the height at which suction nozzle 28 contacted the surface of board S (step S340). The height of the surface of board S, for example, can be obtained from an encoder value of first linear motor 31 or an encoder value of second linear motor 35. After step 340, CPU 41 determines whether all surface heights of board S have been acquired (measured) (step S350), and if not all have been acquired, CPU 41 raises suction nozzle 28 using second raising and lowering drive section 34 (step S360) and performs processing from step S310. On the other hand, if all the surface heights of board S have been acquired, CPU 41 ends the routine. In this manner, it is possible to measure the height of board S at each measurement point.

Figure 7:
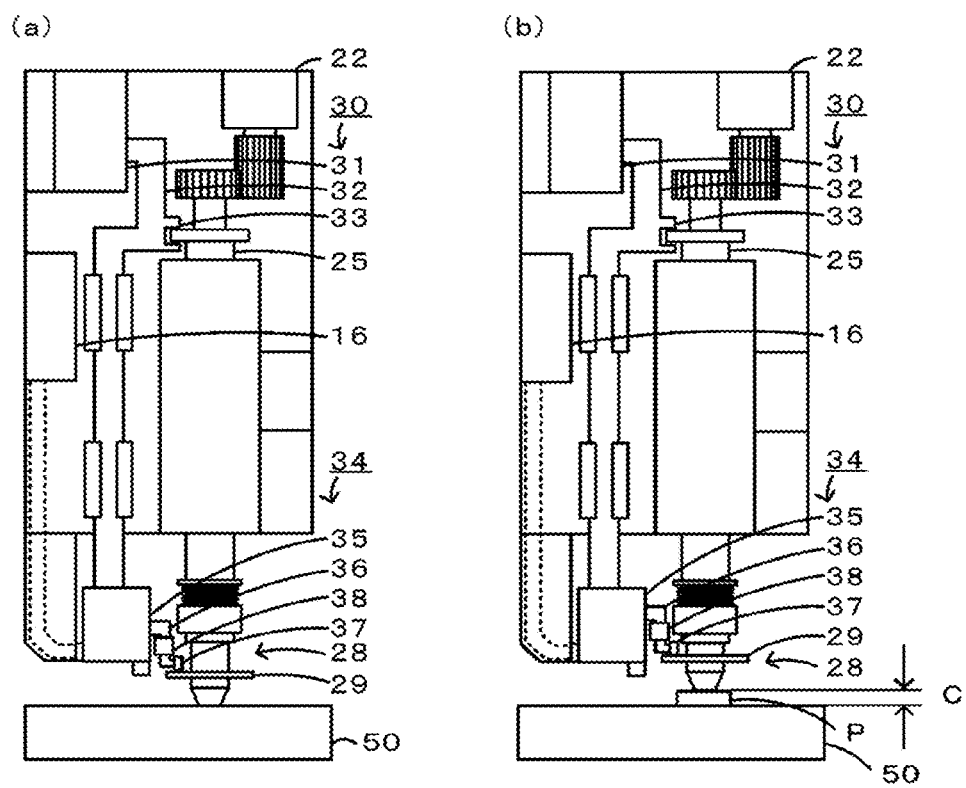
FIG. 7 shows an example of measuring the thickness of component P.

Next, descriptions are given of measuring the thickness (height) of component P. FIG. 7 shows an example of measuring the thickness of component P, with FIG. 7(a) showing measurement of a reference surface, and FIG. 7(b) showing measurement of the thickness of component P. With this processing, except for performing processing of contacting component P against the reference surface of reference member 50 with component P being held by suction nozzle 28 in step S320, processing is the same as with the above height measurement of board S. The thickness of component P can be obtained from the difference between the measurement value of the reference surface and the measurement value with component P being held (refer to thickness C of FIG. 7[b]). In this manner, it is possible to measure the thickness of component P.

Figure 8:
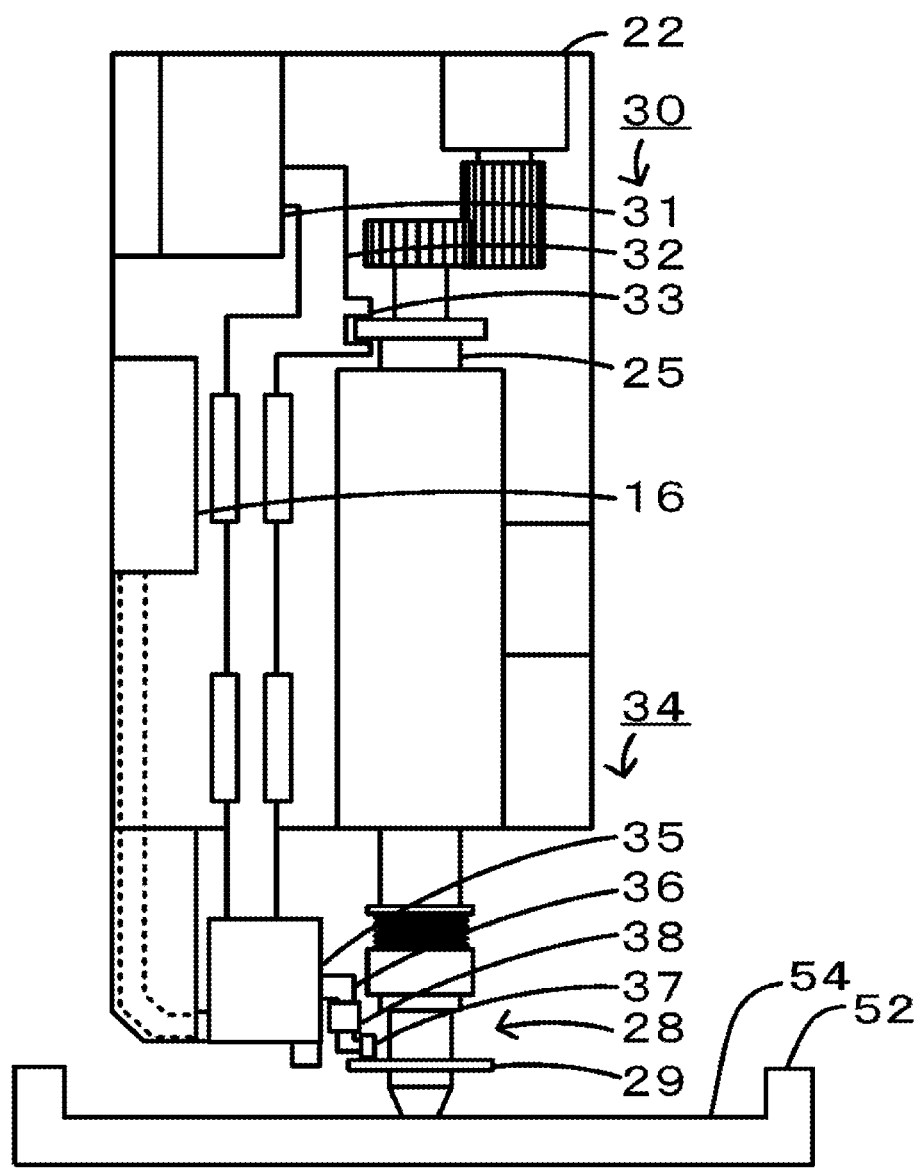
FIG. 8 shows an example of measuring the stage height of transfer stage 54.

Further, described now is measurement of the height of transfer stage 54. FIG. 8 shows an example of measuring the stage height of transfer stage 54. With this processing, except for performing processing of contacting suction nozzle 28 against the stage upper surface of transfer stage 54 in step S320, processing is the same as with the above height measurement of board S. The height of transfer stage 54 can be obtained from the difference between the measured value of the reference surface and the measured value with suction nozzle 28 contacting the stage upper surface of transfer stage 54. In this manner, it is possible to measure the height of transfer stage 54. Note that, the height of transfer stage 54 may be acquired by measuring the height of a portion other than transfer stage 54 of transfer tank 52.

Figure 9:
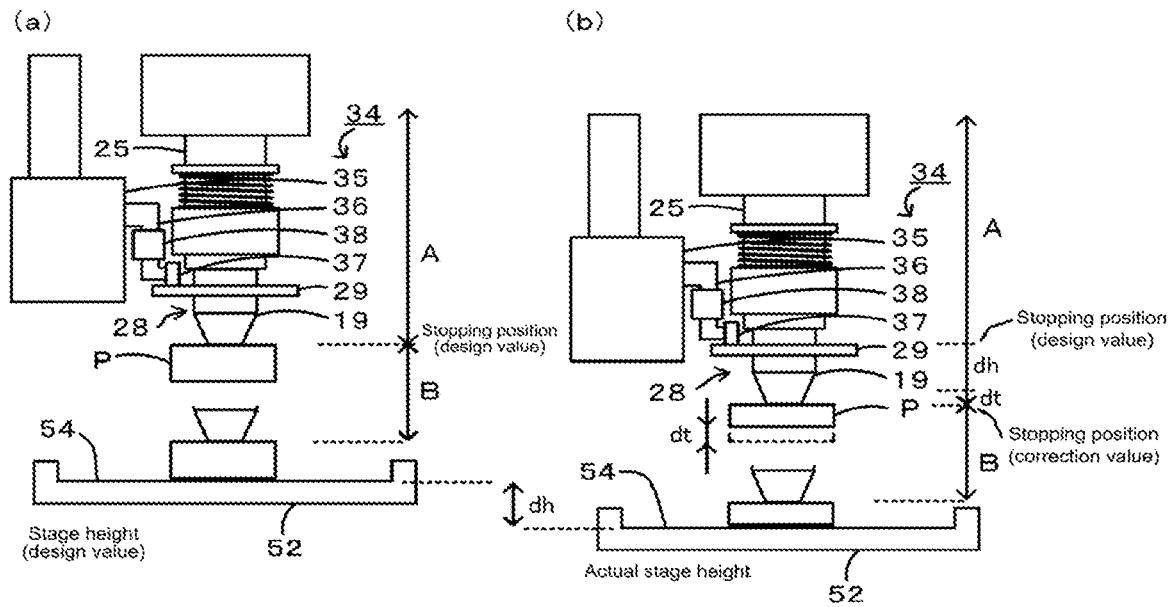
FIG. 9 illustrates setting of a raising and lowering correction value during transfer of first raising and lowering drive section 30.

Returning to the mounting processing routine of FIG. 4, when the height information is acquired in step S130, CPU 41 sets a raising and lowering correction value during transfer that is a raising and lowering correction value of first raising and lowering drive section 30 when transferring a transfer film to the component based on the acquired height information (step S140). The raising and lowering correction value during transfer is a value for correcting the stopping position of syringe member 25 at transfer stage 54. Also, the raising and lowering correction value may be a value such that syringe member 25 stops at a position such that the distance between transfer stage 54 and syringe member 25 is a distance corresponding to a raising and lowering stroke (distance B) of suction nozzle 28 by second raising and lowering drive section 34. For example, the raising and lowering correction value during transfer may be a value such that, with the stroke of second raising and lowering drive section 34 being fixed, the stopping position of syringe member 25 by first raising and lowering drive section 30 is closer to transfer stage 54 in accordance with the height of transfer stage 54 and the thickness of component P. FIG. 9 illustrates the setting of the raising and lowering correction value during transfer, with FIG. 9(a) showing the design value, and FIG. 9(b) showing the correction value. Here, dh is the difference of the measured stage height with respect to the design stage height of transfer unit 15, and dt is the difference of the measured component thickness with respect to the design thickness of component P. These differences dh and dt are calculated by CPU 41 based on the height information acquired in step S130. In this manner, in cases in which the actual measured stage height differs from the design value of the stage height of transfer stage 54, and cases in which the actual measured component thickness differs from the design value component thickness, a correction value of the stopping position of syringe member 25 is set as a value that cancels the difference in the actual measured stage height and the design value stage height. That is, in a case in which the dh of the actual measured stage height with respect to the design value of the stage height of transfer stage 54 is low, or the dt of the actual measured component thickness with respect to the design value component thickness is thin, the raising and lowering correction value during transfer is set such that the stopping position of syringe member 25 is lower than the design value by dh+dt. For this raising and lowering correction value during transfer, the lower the height of transfer stage 54, the lower the stopping position of syringe member 25 by first raising and lowering drive section 30 corresponding to the height of transfer stage 54, and the thinner the thickness of component P, the lower the stopping position by first raising and lowering drive section 30 corresponding to that thickness of component P. In a similar manner, for the raising and lowering correction value during transfer, the higher the height of transfer stage 54, the higher the stopping position of syringe member 25 by first raising and lowering drive section 30 corresponding to the height of transfer stage 54, and the thicker the thickness of component P, the higher the stopping position by first raising and lowering drive section 30 corresponding to that thickness of component P.

After step S140, CPU 41 performs moving processing to move mounting head 22 above transfer stage 54 (step S150), and controls first raising and lowering drive section 30 (first linear motor 31) using the set raising and lowering correction value during transfer (step S160). When syringe member 25 stops, CPU 41 performs lowering control of second raising and lowering drive section 34 (second linear motor 35) (step S170). Note that, here, CPU 41 performs lowering control of second raising and lowering drive section 34 after syringe member 25 has stopped, but second raising and lowering drive section 34 may be lowered before syringe member 25 has stopped.

With mounting device 11, in a case in which second raising and lowering drive section 34 is raised and lowered without using height information, a relatively large margin is required for the stopping position of first raising and lowering drive section 30 such that component P does not strike transfer stage 54. Therefore, the stroke of second raising and lowering device 34 becomes longer. Also, in a case in which height information is not used, when the height of transfer stage 54 is low, or the thickness of component P is smaller, the stopping position of first raising and lowering drive 30 must be relatively high such that component P does not strike transfer stage 54; and the stroke of second raising and lowering drive section 34 must be even longer for the lower height of transfer stage 54 and the thinner thickness of component P. In a case in which height information is not used, as in FIG. 9(b), because syringe member 25 stops at the design value stopping position, movement after that is the stroke of second raising and lowering drive section 34, and compared to a case in which the stopping position of syringe member 25 has not been corrected, the stroke of second raising and lowering drive section 34 is longer by dh+dt. With mounting device 11, by using height information, it is possible to move the entire syringe member 25 to a position closer to transfer stage 54 in accordance with the height of transfer stage 54 and the thickness of component P, and the above margin can be made smaller.

Continuing, CPU 41 determines whether a load has been detected by detecting section 38 (step S180), and if a load has not been detected, processing continues to step S170. On the other hand, if a load has been detected by detecting section 38, component P is considered to have contacted transfer stage 54, and CPU 41 performs control of second raising and lowering drive section 34 such that a specified load is applied and transfer material is transferred to component P(step S190). In this manner, because transfer operation to component P is performed using an output value of detecting section 38, it is possible to reduce the load applied to component P.

Figure 10:
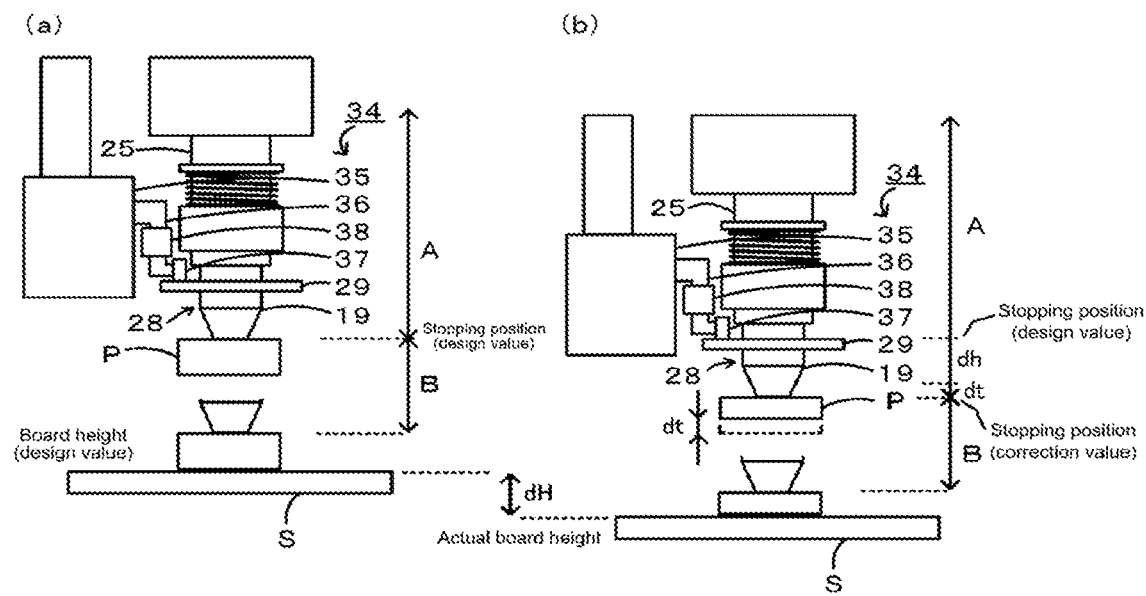
FIG. 10 illustrates setting of a raising and lowering correction value during arrangement of first raising and lowering drive section 30.

When transfer of transfer material to component P is completed, CPU 41 raises suction nozzle 28 to its initial height using second raising and lowering drive section 34 (step S200), and performs arrangement processing of component P to the board from step S210. CPU 41 sets a raising and lowering correction value during arrangement that is a raising and lowering correction value of first raising and lowering drive section 30 when arranging component P on a board, based on acquired height information (step S210). The raising and lowering correction value during arrangement is a value correcting the stopping position of syringe member 25 above board S. Also, the raising and lowering correction value during arrangement may be a value such that syringe member 25 stops at a position such that the distance between board S and syringe member 25 is a distance corresponding to a raising and lowering stroke (distance B) of suction nozzle 28 by second raising and lowering drive section 34. For example, the raising and lowering correction value during arrangement may be a value such that, with the stroke of second raising and lowering drive section 34 being fixed, the stopping position of syringe member 25 by first raising and lowering drive section 30 is closer to board S in accordance with the height of board S and the thickness of component P. FIG. 10 illustrates the setting of the raising and lowering correction value during arrangement, with FIG. 10(a) showing the design value, and FIG. 10(b) showing the correction value. Here, dH is the difference of the measured height of board S with respect to the design value of the height of board S, and dt is the difference of the measured component thickness with respect to the design thickness of component P. These differences dH and dt are calculated by CPU 41 based on the height information acquired in step S130. In this manner, in cases in which the actual measured board height differs from the design value board height, and cases in which the actual measured component thickness differs from the design value component thickness, a correction value of the stopping position of syringe member 25 is set as a value that cancels the difference in the actual measured board height and the design value board height. That is, in a case in which the dH of the actual measured board height with respect to the design value board height is low, or the dt of the actual measured component thickness with respect to the design value component thickness is thin, the raising and lowering correction value during arrangement is set such that the stopping position of syringe member 25 is lower than the design value by dH+dt. For this raising and lowering correction value during arrangement, the lower the height of board 5, the lower the stopping position of syringe member 25 by first raising and lowering drive section 30 corresponding to the height of transfer stage 54, and the thinner the thickness of component P, the lower the stopping position by first raising and lowering drive section 30 corresponding to that thickness of component P. In a similar manner, for the raising and lowering correction value during arrangement, the higher the height of board S, the higher the stopping position of syringe member 25 by first raising and lowering drive section 30 corresponding to the height of board S, and the thicker the thickness of component P, the higher the stopping position by first raising and lowering drive section 30 corresponding to that thickness of component P.

After step S210, CPU 41 performs moving processing to move mounting head 22 to the arrangement position of component P (step S220), and controls first raising and lowering drive section 30 (first linear motor 31) using the set raising and lowering correction value (step S230). When syringe member 25 stops, CPU 41 performs lowering control of second raising and lowering drive section 34 (second linear motor 35) (step S240). Note that, here, CPU 41 performs lowering control of second raising and lowering drive section 34 after syringe member 25 has stopped, but second raising and lowering drive section 34 may be lowered before syringe member 25 has stopped.

With mounting device 11, in a case in which second raising and lowering drive section 34 is raised and lowered without using height information, a relatively large margin is required for the stopping position of first raising and lowering drive section 30 such that component P does not strike board S. Therefore, the stroke of second raising and lowering device 34 becomes longer. Also, in a case in which height information is not used, when the height of board S is low, or the thickness of component P is smaller, the stopping position of first raising and lowering drive 30 must be relatively high such that component P does not strike board S; and the stroke of second raising and lowering drive section 34 must be even longer for the lower height of board S and the thinner thickness of component P. In a case in which height information is not used, as in FIG. 10(b), because syringe member 25 stops at the design value stopping position, movement after that is the stroke of second raising and lowering drive section 34, and compared to a case in which the stopping position of syringe member 25 has not been corrected, the stroke of second raising and lowering drive section 34 is longer by dH+dt. With mounting device 11, by using height information, it is possible to move the entire syringe member 25 to a position closer to board S in accordance with the height of board S and the thickness of component P, and the above margin can be made smaller.

Continuing, CPU 41 determines whether a load has been detected by detecting section 38 (step S250), and if a load has not been detected, processing continues to step S240. On the other hand, if a load has been detected by detecting section 38, component P is considered to have contacted board S, and CPU 41 performs release of component P along with control of second raising and lowering drive section 34 such that the load is a specified mounting load (step S260). In this manner, because component P is arranged on board S using an output value of detecting section 38, it is possible to reduce the load applied to component P.

When component P has been released, CPU 41 determines whether mounting processing for the current board has been completed (step S270), and if it has not, raises suction nozzle 28 to its initial height using second raising and lowering drive section 34 (step S280), and performs processing from S120. That is, CPU 41 sets the next component to be picked up, acquires height information, and performs transfer of transfer material to component P while controlling first raising and lowering drive section 30 using the raising and lowering correction value during transfer set based on the height information, and arranges the component P on board S while controlling first raising and lowering drive section 30 using the raising and lowering correction value during arrangement set based on the height information. On the other hand, if mounting processing of the current board is complete in step S270, CPU 41 unloads the completed board S (step S290) and determines whether production is complete (step S295). If production is not complete, CPU 41 performs processing from step S110. That is, CPU 41 conveys and fixes a new board, and performs processing from step S120. On the other hand, if production is complete in step S295, CPU 41 ends the routine.

Correspondences between constituent elements of the present embodiment and constituent elements of the invention will be clarified here. First raising and lowering drive section 30 of the present embodiment corresponds to the first raising and lowering section of the present invention, second raising and lowering section 34 corresponds to the second raising and lower section, suction nozzle 28 corresponds to the pickup member, syringe member 25 to which suction nozzle 28 is attached corresponds to the raising and lowering member, detecting section 38 and control section 40 correspond to the measuring section, and control device 40 corresponds to the control section. Note that, with the present embodiment, an example of the present invention of a control method of a mounting device is clear from the description of operation of mounting device 11.

Mounting device 11 of the embodiment described above is provided with first raising and lowering drive section 30 configured to raise and lower the entire syringe member 25 (raising and lowering member) to which suction nozzle 28 that picks up component P is attached, and second raising and lowering drive section 34 that raises and lowers suction nozzle 28 with respect to syringe member 25 to which suction nozzle 28 is attached. And, mounting device 11 controls at least raising and lowering operation of first raising and lowering drive section 30 based on height information that includes at least one of information of the thickness of component P, information of the height of board S, or information of the height of the stage of transfer stage 54 measured by detecting section 38 and control device 40. With mounting device 11, it is possible to move the entire syringe member 25 to which suction nozzle 28 is attached to a position closer to transfer stage 54 and board S in accordance with the height of board S, the thickness of component P, and the height of transfer stage 54. Therefore, mounting device 11, in a configuration that raises and lowers syringe member 25 to which suction nozzle 28 is attached and that raises and lowers suction nozzle 28 itself, the raising and lowering stroke of suction nozzle 28 can be shortened. Thus, with mounting device 11, the unit can be made more compact.

Also, CPU 41, using the information of the stage height and/or the component thickness included in the height information, controls raising and lowering operation of first raising and lowering drive section 30 such that syringe member 25 is positioned at a stopping position such that the distance between transfer stage 54 and syringe member 25 is a distance corresponding to a raising and lowering stroke of suction nozzle 28. Also, CPU 41, using the information of the board height and/or the component thickness included in the height information, controls raising and lowering operation of first raising and lowering drive section 30 such that syringe member 25 is positioned at a stopping position such that the distance between board S and syringe member 25 is a distance corresponding to a raising and lowering stroke of suction nozzle 28. Therefore, suction nozzle 28 can be brought closer to transfer stage 54 or board S without changing the stroke of second raising and lowering drive section 34. Also, CPU 41 calculates at least one of (a) height difference value dh of the height of transfer stage 54 measured by detecting section 38 and control device 40 with respect to a design value of the height of transfer stage 54, or (b) a thickness difference value dt of the component thickness measured by detecting section 38 and control device 40 with respect to a design value of the thickness of component P, sets a raising and lowering correction value during transfer of the stopping position of syringe member 25 with respect to a design value stopping position based on the calculated height differences dh and/or thickness difference dt, and controls raising and lowering operation of first raising and lowering drive section 30 when transferring a transfer film to component P using the raising and lowering correction value during transfer. Also, CPU 41 calculates at least one of (a) height difference value dH of the height of board S measured by detecting section 38 and control device 40 with respect to a design value of the height of board S, or (b) a thickness difference value dt of the component thickness measured by detecting section 38 and control device 40 with respect to a design value of the thickness of component P, sets a raising and lowering correction value during arrangement of the stopping position of syringe member 25 with respect to a design value stopping position based on the calculated height differences dH and/or thickness difference dt, and controls raising and lowering operation of first raising and lowering drive section 30 when arranging component P on board S using the raising and lowering correction value during arrangement. In this manner, because the stopping position of syringe member 25 is corrected based on a height difference value, the stroke of second raising and lowering drive section 34 can be made shorter compared to a case in which such a correction is not made. Further, because CPU 41 measures the height of the stage of transfer stage 54 and the thickness of component P based on a detection result of detecting section 38, it is possible to measure the height of the stage of transfer stage 54 and the thickness of component P using detecting section 38 that detects a load applied to suction nozzle 28.

Meanwhile, it goes without saying that the invention is not limited to the above-mentioned embodiment and various embodiments may be applied within the technical scope of the invention.

For example, in an embodiment above, CPU 41 sets the entire amount of height difference value dh and thickness difference value dt as the raising and lowering correction value during transfer, but only a portion of the difference values may be set as the raising and lowering correction value during transfer, with the remaining portion of the difference value being covered by the raising and lowering stroke of suction nozzle 28 by the second raising and lowering drive section 34. Similarly, only a portion of height difference value dH and thickness difference value dt may be set as the raising and lowering correction value during arrangement, with the remaining portion of the difference value being covered by the raising and lowering stroke of suction nozzle 28 by the second raising and lowering drive section 34. In this case, it is desirable for CPU 41 to set the raising and lowering correction value during transfer or the raising and lowering correction value during arrangement such that, with respect to the difference value, the correction value is larger than the stroke covered by second raising and lowering drive section 34. That is, if a value larger than half the difference value is set as the correction value, the amount covered by the stroke of second raising and lowering drive section 34 is smaller, and the stroke of second raising and lowering drive section 34 can be made shorter.

In an embodiment above, CPU 41 may control raising and lowering operation of first raising and lowering drive section 30 such that the separation distance between transfer stage 54 and component P being held by suction nozzle 28 at a reference height of suction nozzle 28 at a stopping position of syringe member 25 is a constant distance, based on the height information. By doing this, raising and lowering operation of suction nozzle 28 becomes fixed with respect to syringe member 25, and the raising and lowering stroke of second raising and lowering drive section 34 can be made shorter. The reference height of suction nozzle 28, for example, may be the upper limit position of suction nozzle 28 with respect to syringe member 25, or may be a position at which suction nozzle 28 has been lowered by a specified amount by second raising and lowering drive section 34.

In the above embodiments, the height of transfer stage 54, the height of board S, and the thickness of component P are measured using detecting section 38, but the configuration is not limited to this. For example, the thickness of component P may be obtained using an image captured by imaging unit 16. Also, the height of transfer stage 54 and the height of each point on board S may be obtained using a laser-type distance measuring sensor. Or, the height of transfer stage 54 and the height of each point on board S may be obtained based on an image of transfer stage 54 or board S captured from above. Or, the height of each point on board S may be obtained using a push stroke of or a pressure applied to a support pin that supports board S from below.

In the above embodiments, height information included both the height of transfer stage 54 and the thickness of component P for transfer, and height information included both the height of board S and the thickness of component P for arrangement of component P on board S, but the configuration is not limited to this, and at least one of the pieces of height information may be omitted for each of transfer and arrangement. Even in this case, it is possible to reduce the raising and lowering stroke of suction nozzle 28 using height information of either transfer stage 54 or the thickness of component P during transfer, or using height information of either board S or the thickness of component P during arrangement.

In the embodiments above, raising and lowering operation of the first raising and lowering drive section is controlled based on height information for both transfer and arrangement, but it is sufficient if raising and lowering operation of the first raising and lowering drive section is controlled based on height information for either of transfer or arrangement.

In the embodiments above, raising and lowering operation of first raising and lowering drive section 30 is controlled based on information of the thickness of component P, but a lower surface height of a lower surface of component held by suction nozzle 28 may be measured using detecting section 38 or imaging unit 16, and raising and lowering operation of first raising and lowering drive section 30 may be controlled based on the information of the lower surface height of component P.

In the above embodiments, the present invention is described as mounting device 11, but the present invention may be, for example, a control method of mounting device 11, or a program run by a computer that performs the above processing.

INDUSTRIAL APPLICABILITY

The present invention may be used on a device that performs mounting processing of arranging components on a board.

REFERENCE SIGNS LIST

11: mounting device; 12: board conveyance unit; 13: mounting unit; 14: component supply unit; 15: transfer unit; 16: imaging unit; 17: Y slide; 18: X slide; 19: pipe section; 20: head moving section; 22: mounting head; 23: Q-axis motor; 24, 26: gear; 25: syringe member; 27: horizontal section; 28: suction nozzle; 29: flange; 30: first raising and lowering drive section; 31: first linear motor; 32: first support member; 33: first engaging section; 34: second raising and lowering drive section; 35: second linear motor; 36: second support member; 37: second engaging section; 38: detecting section; 39: feeder support table; 40: control device; 41: CPU; 42: ROM; 43: HDD; 44: RAM; 45: input/output interface; 46: bus; 50: reference member; 52: transfer tank; 54: transfer stage; 56: tape feeder; P: component; S: board

The invention claimed is:

1. A mounting device for arranging components on a board, the mounting device comprising:
   a mounting head including a raising and lowering member to which a pickup member configured to pick up a component is attached;
   a head moving section configured to horizontally move the mounting head;
   a first raising and lowering drive section configured to vertically raise and lower the raising and lowering member;
   a second raising and lowering drive section configured to vertically raise and lower the pickup member with respect to the raising and lowering member;
   a transfer device including a transfer stage, the transfer device being configured to form a transfer film of a transfer material on the transfer stage;
   a height measurement device including a detecting section which detects a load applied to the pickup member, the height measurement device being configured to measure at least one of a stage height of the transfer stage or a component thickness of the component by acquiring a height of the pickup member when the load applied to the pickup member is detected by the detecting section; and
   a control section configured to control raising and lowering operation of at least the first raising and lowering drive section when transferring the transfer film to the component, the control of the raising and lowering operation by the control section is based on height information that includes at least one of information of the component thickness measured by the height measurement device or information of the stage height measured by the height measurement device.

2. The mounting device according to claim 1,
   wherein the component thickness is configured to be measured by the height measurement device while the component is held by the pickup member and in contact with the stage, and
   wherein the component thickness is configured to be calculated by the control section based on a difference between a measured value of the stage height and a measured value when the component is held by the pickup member and in contact with the stage.

3. A mounting device for arranging components on a board, the mounting device comprising:
   a mounting head including a raising and lowering member to which a pickup member configured to pick up a component is attached;
   a head moving section configured to horizontally move the mounting head;
   a first raising and lowering drive section configured to vertically raise and lower the raising and lowering member;
   a second raising and lowering drive section configured to vertically raise and lower the pickup member with respect to the raising and lowering member;
   a transfer device including a transfer stage, the transfer device being configured to form a transfer film of a transfer material on the transfer stage;
   a height measurement device including a detecting section which detects a load applied to the pickup member, the height measurement device being configured to measure at least one of a stage height of the transfer stage or a lower surface height of a lower surface of the component held by the pickup member by acquiring a height of the pickup member when the load applied to the pickup member is detected by the detecting section; and
   a control section configured to control raising and lowering operation of at least the first raising and lowering drive section when transferring the transfer film to the component, the control of the raising and lowering operation by the control section is based on height information that includes at least one of information of the lower surface height measured by the height measurement device or information of the stage height measured by the height measurement device.

4. A control method of a mounting device, the mounting device including: a mounting head including a raising and lowering member to which a pickup member configured to pick up a component is attached; a head moving section configured to horizontally move the mounting head; a first raising and lowering drive section configured to vertically raise and lower the raising and lowering member; a second raising and lowering drive section configured to vertically raise and lower the pickup member with respect to the raising and lowering member; and a transfer device including a transfer stage, the transfer device being configured to form a transfer film of a transfer material on the transfer stage; and a height measurement device including a detecting section which detects a load applied to the pickup member, the height measurement device being configured to measure at least one of a stage height of the transfer stage or a component thickness of the component by acquiring a height of the pickup member when the load applied to the pickup member is detected by the detecting section, the control method comprising:

controlling raising and lowering operation of at least the first raising and lowering drive section when the component contacts the transfer film, the control of the raising and lowering operation by the control section is based on height information that includes at least one of information of component thickness measured by the height measurement device or information of stage height measured by the height measurement device.

* * * * *